_(12)_ United States Patent
Kubota et al.

(10) Patent No.: US 7,923,835 B2
(45) Date of Patent: Apr. 12, 2011

(54) PACKAGE, ELECTRONIC DEVICE, SUBSTRATE HAVING A SEPARATION REGION AND A WIRING LAYERS, AND METHOD FOR MANUFACTURING

(75) Inventors: Yoshihiro Kubota, Kawasaki (JP); Shirou Youda, Kawasaki (JP); Kazuto Tsuji, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 135 days.

(21) Appl. No.: 12/018,263

(22) Filed: Jan. 23, 2008

(65) Prior Publication Data

US 2008/0174005 A1 Jul. 24, 2008

(30) Foreign Application Priority Data

Jan. 23, 2007 (JP) ................. 2007-013159

(51) Int. Cl.
*H01L 23/04* (2006.01)
*H01L 23/48* (2006.01)
*H01L 23/52* (2006.01)
*H01L 29/40* (2006.01)

(52) U.S. Cl. ........ 257/730; 257/678; 257/787; 257/774; 257/E21.523; 257/698

(58) Field of Classification Search .................. 257/678, 257/730, 786, 787, E21.523, 774, 698
See application file for complete search history.

(56) References Cited

FOREIGN PATENT DOCUMENTS

JP 2001-77238 A 3/2001

*Primary Examiner* — Teresa M Arroyo
(74) *Attorney, Agent, or Firm* — Westerman, Hattori, Daniels & Adrian, LLP

(57) ABSTRACT

An electronic device has a substrate that has first and second peripheral portions. The first peripheral portion provides a shearing position for separation. The electronic device has a plurality of wiring layers one of which forms a functional surface wiring on the substrate, an electronic element mounted on the substrate, and an encapsulation member formed over the substrate and the electronic element. The surface wiring is selectively disposed under the encapsulation member and in an area adjacent to the second peripheral portion.

4 Claims, 14 Drawing Sheets

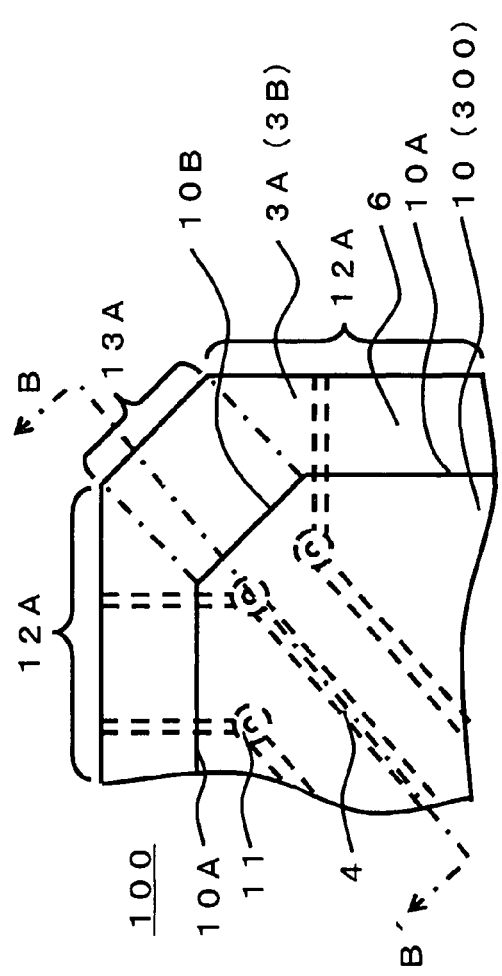
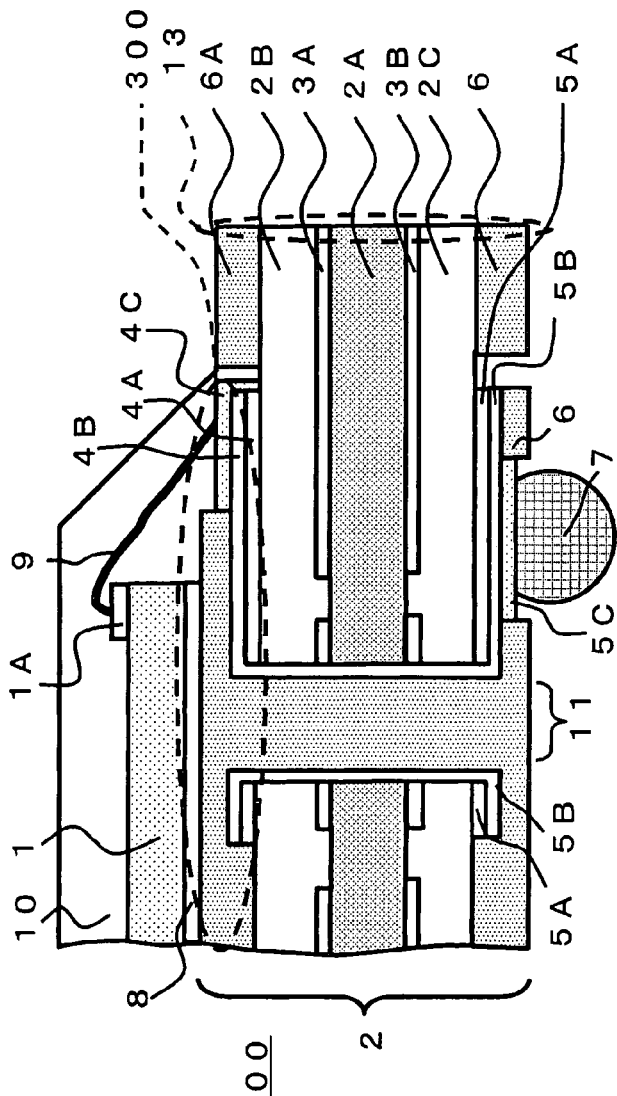
Fig.3A
Fig.3B

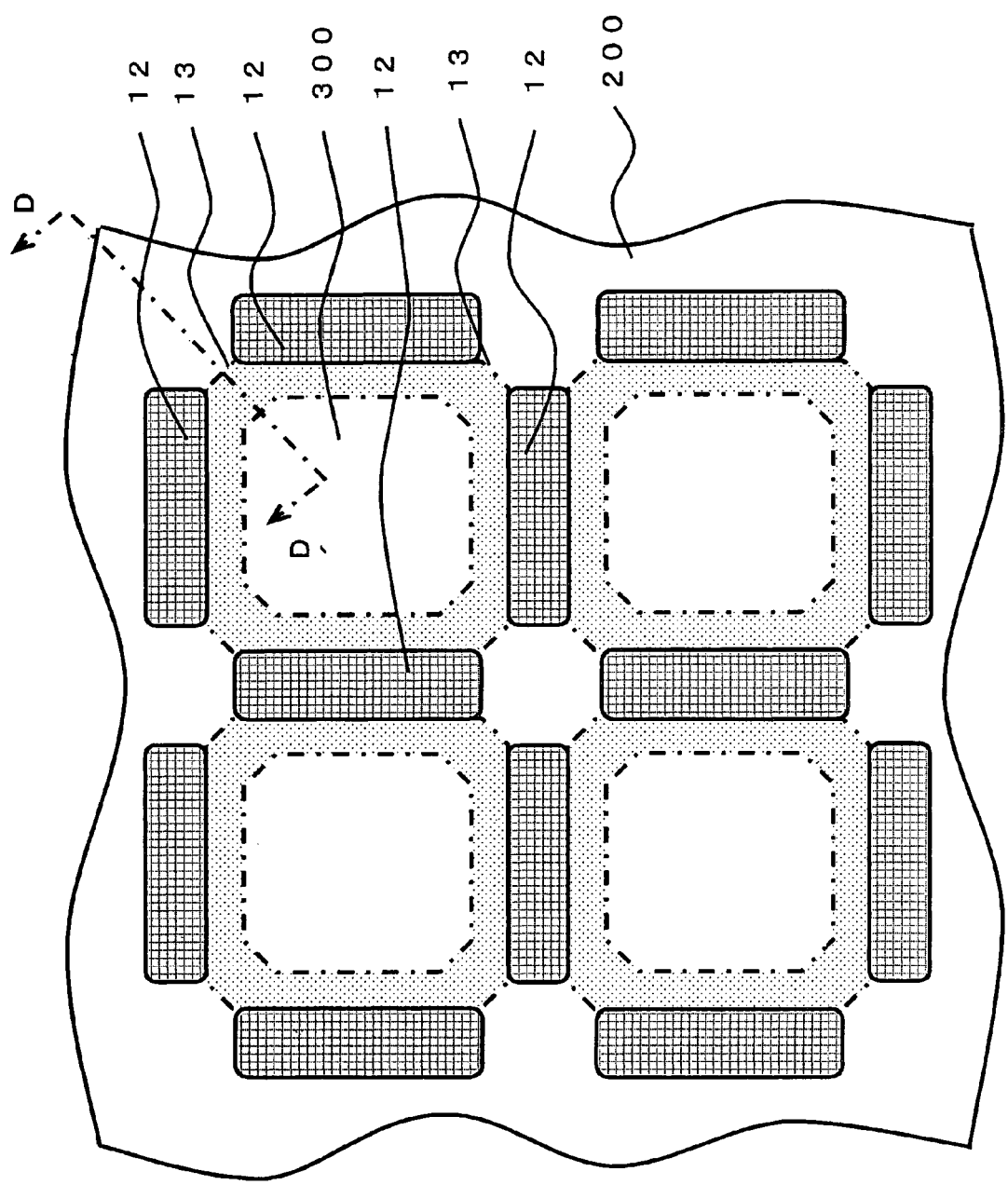

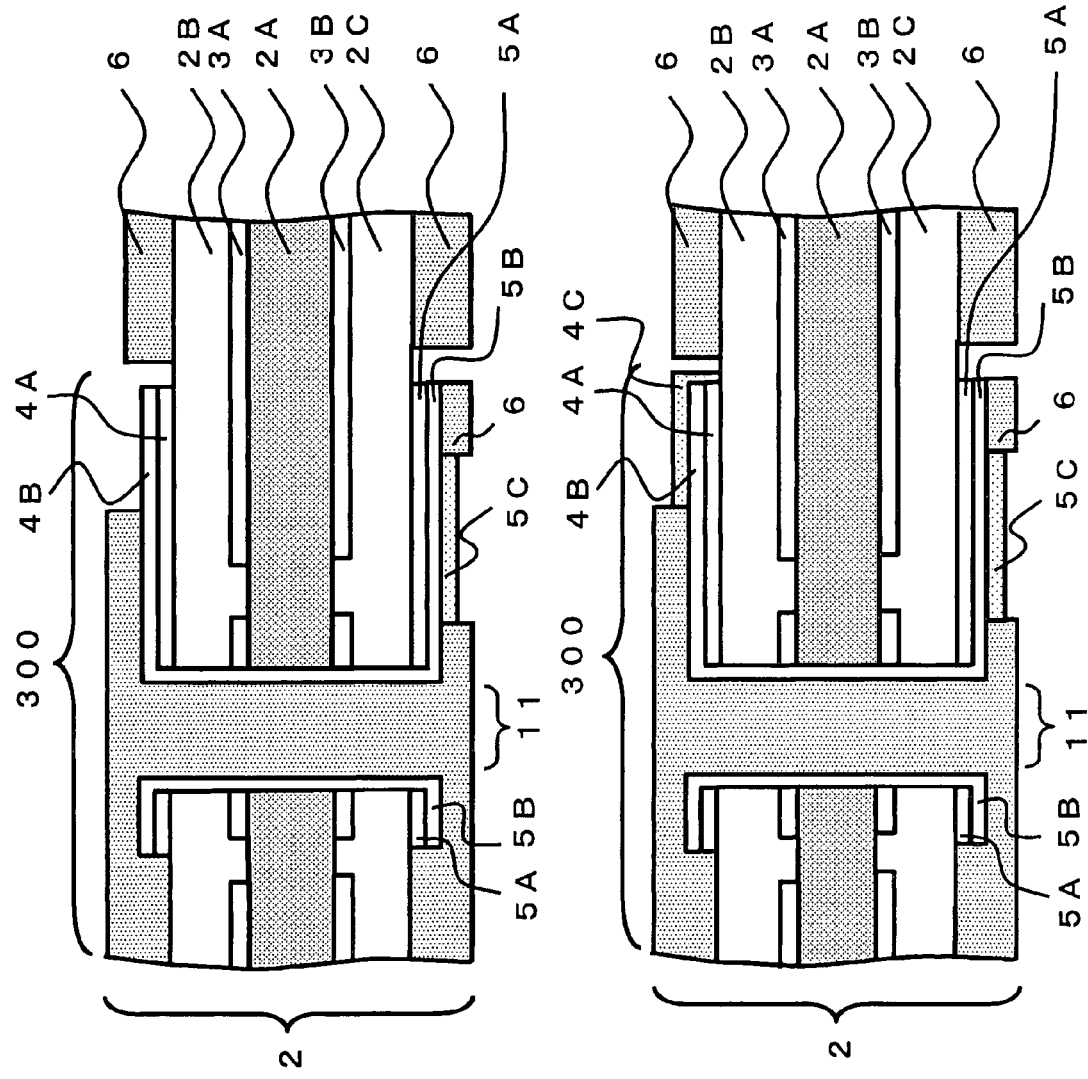

PACKAGE, ELECTRONIC DEVICE, SUBSTRATE HAVING A SEPARATION REGION AND A WIRING LAYERS, AND METHOD FOR MANUFACTURING

BACKGROUND OF THE INVENTION

1. Field of the Invention

The present invention relates to electronic devices, and methods for manufacturing the electronic devices. The present invention particularly relates to an electronic device, and a method for manufacturing the semiconductor device.

2. Description of the Related Art

Plastic ball grid array (PBGA) electronic devices have been proposed because thin electronic devices have been demanded. The PBGA electronic devices include substrates, electronic pieces which are mounted on the substrate and which are sealed with encapsulation resins, and solder balls serving as external terminals. The PBGA electronic devices are characterized in that the thickness of each PBGA electronic device is substantially equal to that of each substrate.

Thin PBGA packages are demanded; hence, substrates used to manufacture the PBGA packages need to be thin. Therefore, there is a problem in that wires arranged on each substrate are broken due to the warpage of the substrate before the substrate is cut into pieces.

A cause of the wire breakage is probably as follows: an external impact load is applied to the substrate in a step of cutting the substrate or during the handling of the substrate in manufacturing steps; hence, cracks are occurred in a solder resist disposed above the substrate. The solder resist is used to protect surface wires. The solder resist is made of a hard, inflexible material and is in contact with the surface wires, which are arranged in a wiring layer located closest to a surface of the substrate. The creation of the cracks generates the force to pull the surface wires in the width direction of the cracks. This causes cracks in the surface wires arranged under the solder resist. The cracks in the surface wires grow because of the mechanical stress caused by the change in the temperature of the usage environment. This will probably break the surface wires.

An increase in the thickness of the surface wires can overcome the breakage of the surface wires but cannot completely prevent the breakage thereof.

Japanese Unexamined Patent Application Publication No. 2001-77238 discloses a semiconductor device including a package in which dummy wires are arranged around wires (regular wires) relating to the operation of an element such that cracks in a substrate do not propagate to the regular wires.

The arrangement of the dummy wires around the regular wires is effective in overcoming the breakage of the regular wires. However, cracks are created in a solder resist disposed above this substrate because of the warpage of this substrate as described above. Therefore, cracks are also created in surface wires arranged under the solder resist. This leads to the breakage of these surface wires.

SUMMARY

According to the present invention, there is provided an electronic device including a substrate that has first and second peripheral portions. The first peripheral portion provides a shearing position for separation. The electronic device has a plurality of wiring layers which forms a functional surface wiring on the substrate, an electronic element mounted over the substrate, and an encapsulation member formed over the substrate and the electronic element. The surface wiring is selectively disposed under the encapsulation member and in an area adjacent to the second peripheral portion.

BRIEF DESCRIPTION OF THE DRAWINGS

FIG. 3A is an enlarged top view of the semiconductor device according to the first embodiment.

FIG. 3B is a sectional view of the semiconductor device according to the first embodiment.

FIG. 7 is an illustration showing a manufacturing step of the semiconductor device according to the second embodiment.

FIGS. 10A and 10B are illustrations showing manufacturing steps of the semiconductor device according to the second embodiment.

DESCRIPTION OF THE PREFERRED EMBODIMENTS

Embodiments of the present invention will now be described. The present invention is not limited to the embodiments.

First Embodiment

A semiconductor device according to a first embodiment of the present invention will now be described in detail with reference to FIGS. 1, 2, 3A, 3B, 4, and 5. The semiconductor device is characterized in that surface wires are prevented from being broken.

Figure 4:
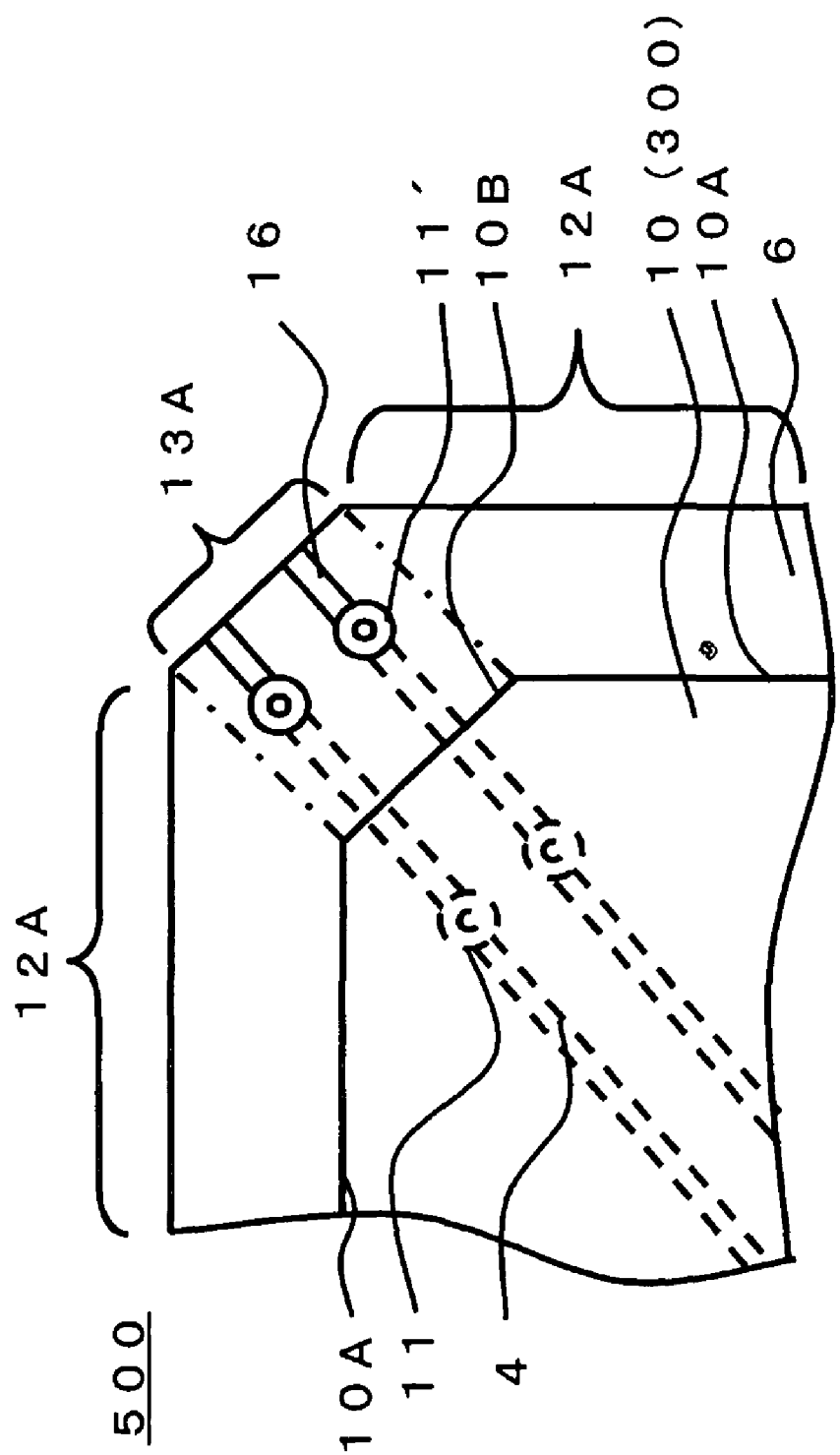
FIG. 4 is an enlarged top view of a first modification of the semiconductor device according to the first embodiment.
Figure 5A:
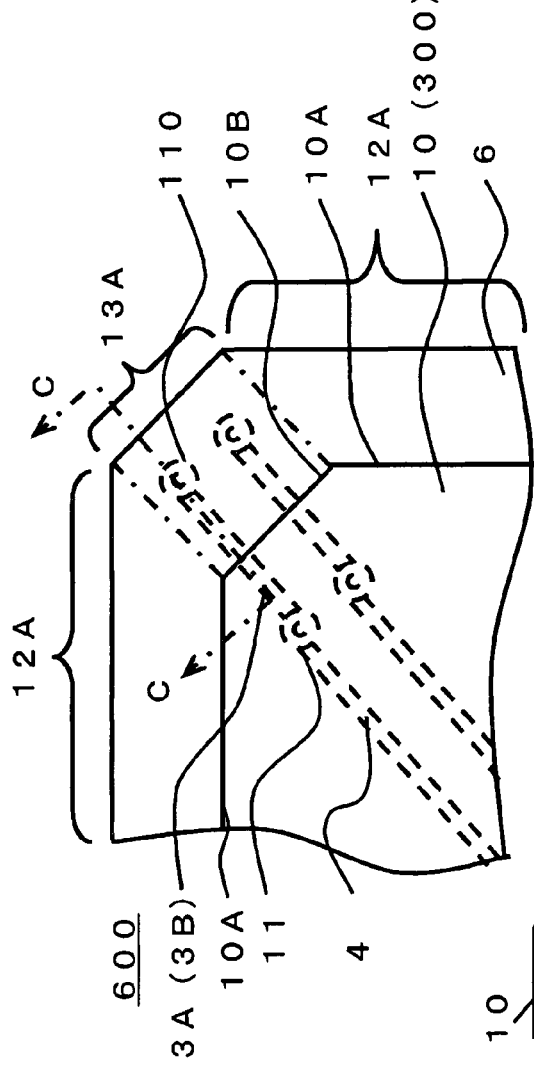
FIG. 5A is an enlarged top view of a second modification of the semiconductor device according to the first embodiment.
Figure 5B:
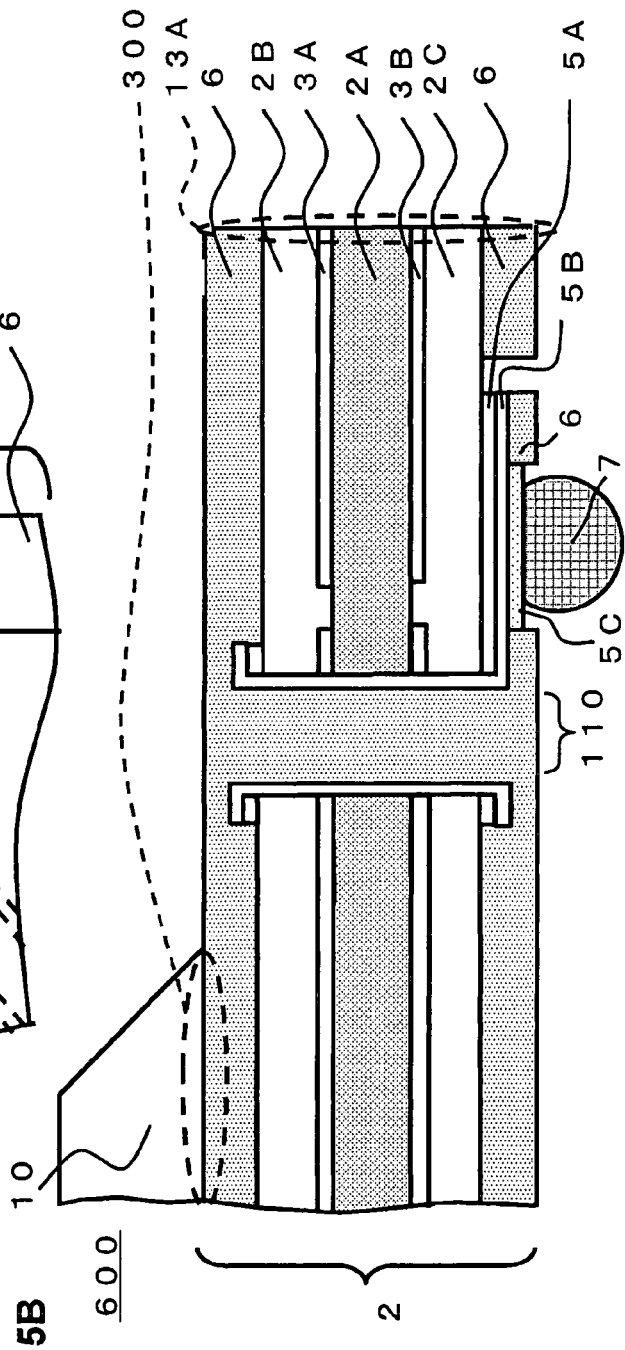
FIG. 5B is a sectional view of the second modification of the semiconductor device according to the first embodiment.

FIGS. 1, 2, 3A, and 3B are illustrations of principal parts of the semiconductor device according to the first embodiment. FIG. 4 is an illustration of a principal part of a first modification of the semiconductor device according to the first embodiment. FIGS. 5A and 5B are illustrations of principal parts of a second modification of the semiconductor device according to the first embodiment.

Figure 1:
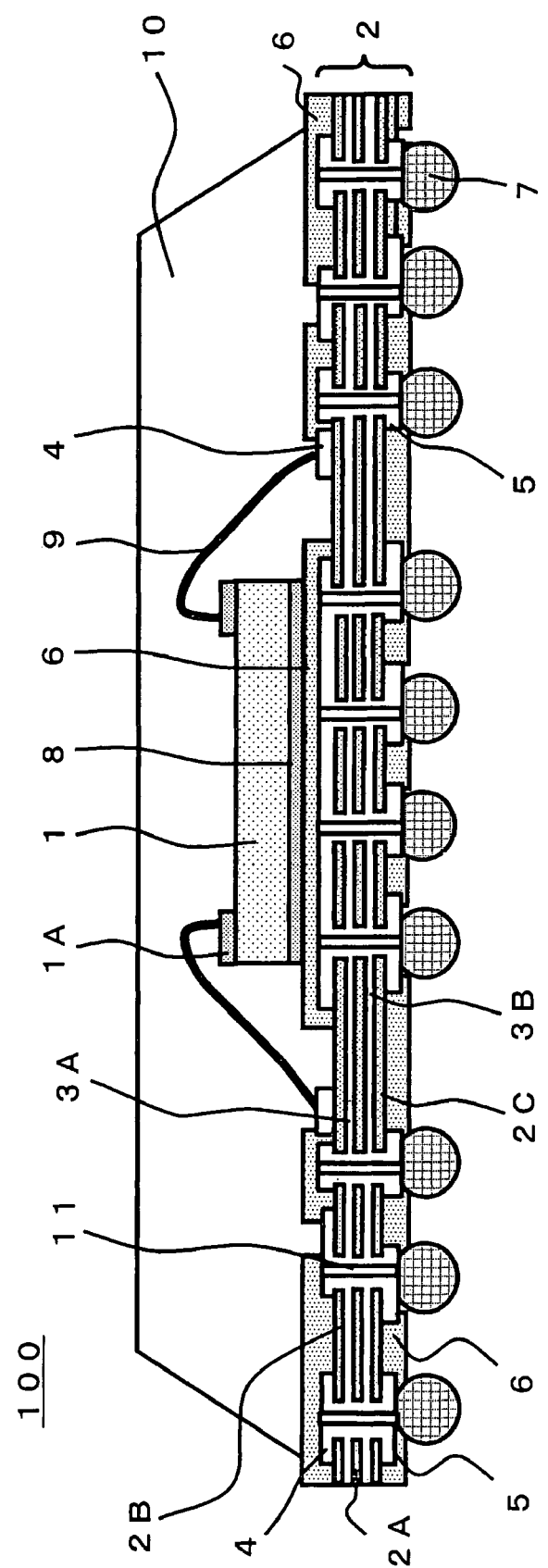
FIG. 1 is an enlarged sectional view of a principal portion of a semiconductor device according to a first embodiment.
Figure 2:
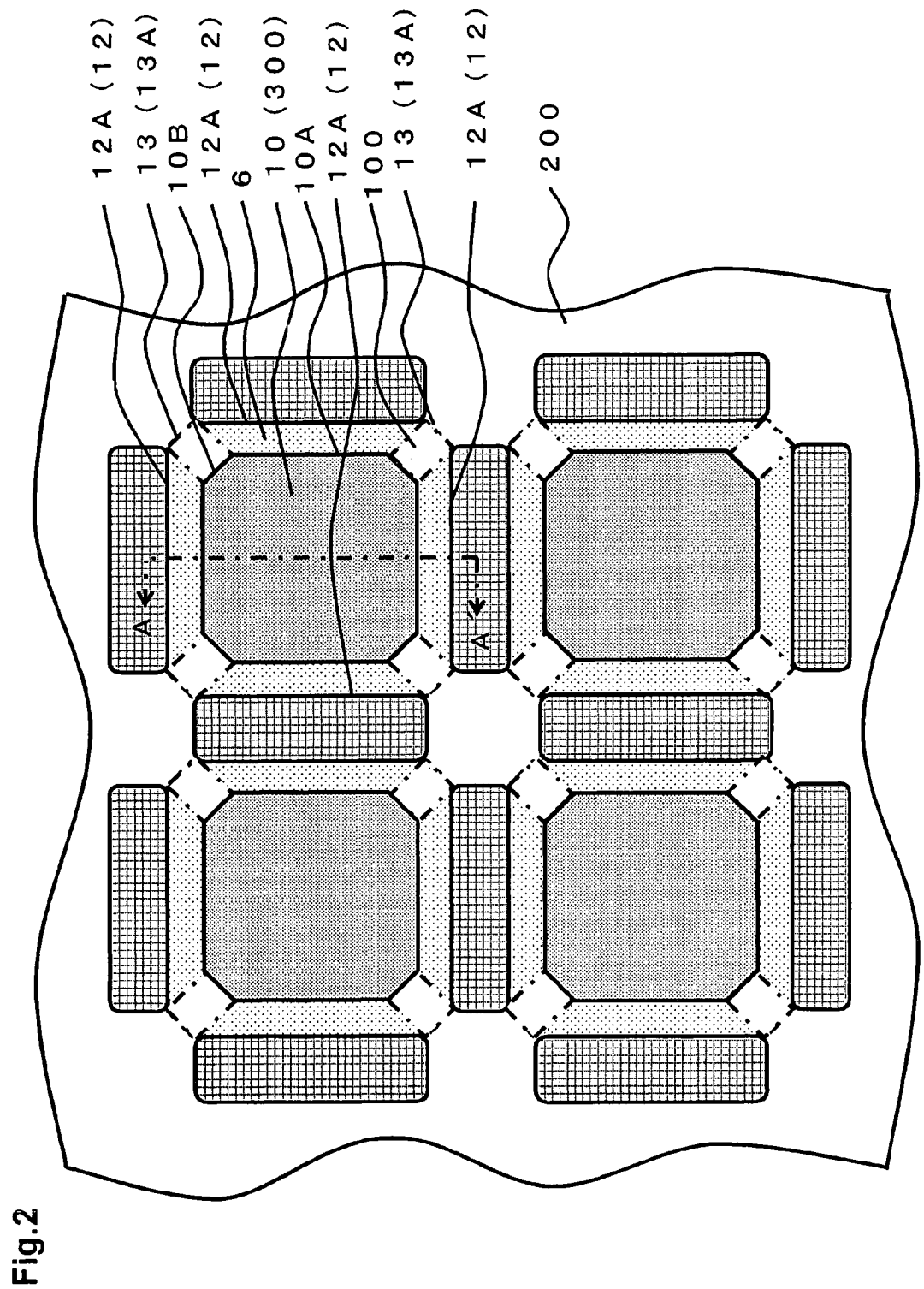
FIG. 2 is a top view of the semiconductor device according to the first embodiment.

FIG. 1 is a sectional view of the semiconductor device 100, according to the first embodiment of the present invention, taken along the line A-A' of FIG. 2. With reference to FIG. 1, the semiconductor device 100 includes a semiconductor piece 1, semiconductor piece electrodes 1A, a substrate 2, a core resin layer 2A, a first laminate resin layer 2B, a second laminate resin layer 2C, first intermediate wires 3A, second intermediate wires 3B, surface wires 4, lower wires 5, solder resist layers 6, solder balls 7, an adhesive layer 8, bonding wires 9, a encapsulation member 10, and through-holes 11.

The semiconductor piece (the electronic element) 1 is a chip prepared by cutting a silicon substrate. The semiconductor piece electrodes 1A are pads for applying a voltage to the semiconductor piece 1 and are made of, for example, aluminum (Al). The semiconductor piece electrodes 1A are arranged on one surface of the semiconductor piece 1.

The substrate 2 includes the core resin layer 2A, the first and second resin layers 2B and 2C, the first and second intermediate wires 3A and 3B, the surface wires 4, the lower wires 5, the solder resist layers 6, and the through-holes 11. Wires included in the substrate 2 are the first and second intermediate wires 3A and 3B, the surface wires 4, and the lower wires 5. These wires are arranged in four wiring layers insulated from each other with the core resin layer 2A, first laminate resin layer 2B, or second laminate resin layer 2C disposed therebetween.

The substrate 2 has a thickness of, for example, 0.56 mm. The core resin layer 2A is made of a material which has a high glass transition point (Tg) and high heat resistance and which is readily drillable. The core resin layer 2A is preferably made of a glass-epoxy resin material. The core resin layer 2A preferably has a thickness of, for example, 0.2 mm. The first and second resin layers 2B and 2C are located on both sides of the core resin layer 2A. The first and second resin layers 2B and 2C are preferably each made from a prepreg with a thickness of, for example, 0.1 mm. The first intermediate wires 3A are located between the core resin layer 2A and the first laminate resin layer 2B. The second intermediate wires 3B are located between the core resin layer 2A and the second laminate resin layer 2C. The first and second intermediate wires 3A and 3B are each made from a copper foil with a thickness of, for example, 36 to 70 μm. Although the first and second intermediate wires 3A and 3B are arranged on both sides of the core resin layer 2A in this embodiment, the first and second intermediate wires 3A and 3B may be omitted.

The surface wires 4 are arranged on the first laminate resin layer 2B. The surface wires (functional surface wires) 4 are preferably made from a laminate including, for example, a copper plating, a nickel plating, and a gold plating. The surface wires 4 have a thickness of, for example, 20 to 25 μm. The surface wires 4 are disposed in a wiring layer which is located in an encapsulation member-forming region 300 shown in FIG. 2 and which is located closest to the encapsulation member 10. In particular, as shown in FIGS. 3A and 3B, the surface wires 4 are disposed in a wiring/packaging permission zone including the encapsulation member-forming region 300 (the substrate under the encapsulation member 10) and regions (second peripheral portion) located between first sides 12A and first peripheral portions 10A of the encapsulation member-forming region 300 that are opposed to the first sides 12A. The surface wires 4 are preferably formed by, for example, etching. The surface wires (functional surface wires) 4 are connected to each other during the operation of the semiconductor device 100 and exclude wires that are not connected to each other during the operation of the semiconductor device 100.

The lower wires 5 are arranged on the second laminate resin layer 2C. The lower wires 5 and the solder balls 7 are arranged on the same surface of the substrate 2. The lower wires 5 have the same thickness as that of the surface wires 4 and are made of the same material as that for forming the surface wires 4.

The solder resist layers 6 are disposed on the substrate 2, which includes the surface wires 4 and the lower wires 5. The solder resist layers 6 are hard coatings. The solder resist layers 6 preferably have a thickness of, for example, 36 μm. Each solder resist layer 6 has first openings through which the surface wires 4 are exposed and which are located at the connections between the semiconductor piece electrodes 1A and the bonding wires 9. The solder resist layer 6 also has second openings through which the lower wires 5 are exposed and which are located at positions where the solder balls 7, which serve as electrode terminals, are placed. The solder balls 7 are external terminals for electrically connecting the semiconductor device 100 to the outside. The solder balls 7 are preferably made of, for example, lead-tin (Pb-Sn). The solder balls 7 are disposed on the lower wires 5. The use of the solder balls 7 as external terminals allows the semiconductor device 100 to have a smaller thickness as compared to the use of leads as external terminals. Metal bumps made of, for example, gold (Au) or lead frames may be used as external terminals instead of the solder balls 7. Alternatively, the lower wires 5 may be used instead of the solder balls 7.

The adhesive layer 8 is used to fix the semiconductor piece 1 above the substrate 2. The adhesive layer 8 is preferably made of a silver-epoxy-based die-bonding material. The bonding wires 9 are used to connect portions of the semiconductor piece electrodes 1A to the surface wires 4 of the substrate 2. The bonding wires 9 are preferably made of, for example, gold, aluminum, or copper. The bonding wires 9 preferably have a diameter of, for example, 30 μm. The encapsulation member 10 is used to seal the semiconductor piece 1 and bonding wires 9 arranged above the upper surface of the substrate 2. The encapsulation member 10 is preferably made of, for example, an epoxy resin over the substrate 2 and the semiconductor piece 1. The encapsulation member 10 preferably has a thickness of, for example, 1.2 mm. The through-holes 11 are each used to connect any one of the surface wires 4, the lower wires 5, and the first and second intermediate wires 3A and 3B to another portion. The through-holes 11 preferably have a diameter of, for example, 0.15 to 0.2 mm. The walls of the through-holes 11 are plated with copper. The through-holes 11 are connected to the lower wires 5 and the solder balls 7, which serve as external electrodes.

FIG. 2 is a top view of the semiconductor device 100 viewed from above. FIG. 2 shows the encapsulation member 10, the first peripheral portions 10A of each encapsulation member-forming region 300 that are opposed to the first sides 12A, second peripheral portions 10B of the encapsulation member-forming region 300 that are opposed to second sides 13A, pores 12, the first sides 12A, connecting portions 13, the second sides 13A, the semiconductor device 100, a base plate 200, and the encapsulation member-forming region 300. The base plate 200 has not yet been subjected to a packaging step or has not yet been cut into pieces. The base plate 200 has the semiconductor device 100 and three semiconductor devices that are the same as the semiconductor device 100. The packaging step includes a placing substep of placing the semiconductor piece 1 on one surface of the substrate 2 such that the semiconductor piece 1 is connected to the surface wires 4 as shown in FIG. 1, a connecting substep of connecting the semiconductor piece 1 to the surface wires 4, and a encapsulation step of forming the encapsulation member 10 over the semiconductor piece 1.

The base plate 200 has the semiconductor device 100. The encapsulation member-forming region 300 is disposed on one surface of the base plate 200 and is covered with the encapsulation member 10. The encapsulation member 10 is surrounded by the first peripheral portions 10A of the encapsulation member-forming region 300 that are opposed to the first sides 12A and the second peripheral portions 10B of the encapsulation member-forming region 300 that are opposed to the second sides 13A. The first peripheral portions 10A provide a shearing position for separation. Each end of the first peripheral portions 10A of the encapsulation member-forming region 300 that are opposed to the first sides 12A is located closest to each end of the first sides 12A. Each end of the second peripheral portions 10B is located closest to each end of the second sides 13A.

The pores 12 are arranged around the encapsulation member 10 and are used to separate off the substrate 2, which is included in the semiconductor device 100, from the base plate 200. The connecting portions 13 are each located between the pores 12. The substrate 2 separated off from the substrate 2 has the first sides 12A that are portions of the pores 12 used to separate off the substrate 2 from the base plate 200, the second sides 13A which are located between the pores 12 and which are formed by cutting (shearing) the base plate 200 after the packaging step, and the encapsulation member-forming region 300 for forming the encapsulation member 10 above one surface of the substrate 2. The substrate 2 has a structure in which the first sides 12A and the second sides 13A are arranged around the encapsulation member-forming region 300. In order to separate off the semiconductor device 100 from the other semiconductor devices by cutting the base plate 200, the following step is performed: a separating step of cutting the connecting portions 13, which are located between the pores 12, along the second sides 13A. Since the pores 12 are present in the base plate 200, stresses are hardly applied to portions between the encapsulation member-forming region 300 and the pores 12 in the separating step. Therefore, portions of the substrate 2 that are located between the encapsulation member-forming region 300 and the pores 12 are less warped than portions of the base plate 200 that are located between the encapsulation member-forming region 300 and the connecting portions 13.

The first peripheral portions of the substrate 2 are surrounded by the shearing portion for separation and the lines between the edge of the shearing portion and the corner edge of the peripheral portion of the encapsulation member 10 and the second peripheral portions of the substrate 2 are outside the substrate 2 under the encapsulation member 10 and the first peripheral portion of the substrate 2.

FIG. 3A is an enlarged top view of the semiconductor device 100. FIG. 3A shows a corner of the semiconductor device 100 separated off from the other semiconductor devices by cutting the connecting portions 13 of the base plate 200 shown in FIG. 2. In particular, FIG. 3A shows the first and second intermediate wires 3A and 3B, the surface wires 4, the solder resist layers 6, the encapsulation member 10, the first peripheral portions 10A of the encapsulation member-forming region 300 that are opposed to the first sides 12A, the second peripheral portions 10B of the encapsulation member-forming region 300 that are opposed to the second sides 13A, the through-holes 11, the first and second sides 12A and 12B, and the encapsulation member-forming region 300, those being portions of the semiconductor device 100. With reference to FIG. 3A, the first sides 12A are located at a corner of the encapsulation member 10 (the encapsulation member-forming region 300). Each second side 13A is located between two of the first sides 12A. The surface wires 4 and the through-holes 11 are arranged in the encapsulation member-forming region 300, on which the encapsulation member 10 is disposed. The first and second intermediate wires 3A and 3B are located between the first sides 12A and the first peripheral portions 10A of the encapsulation member-forming region 300 that are opposed to the first sides 12A.

FIG. 3B is a sectional view of the semiconductor device 100 taken along the line B-B' of FIG. 3A. FIG. 3B shows the semiconductor piece 1, the semiconductor piece electrodes 1A, the substrate 2, the core resin layer 2A, the first and second resin layers 2B and 2C, the first and second intermediate wires 3A and 3B, first base platings 4A, first copper platings 4B, first nickel-gold platings 4C, second base platings 5A, second copper platings 5B, second nickel-gold platings 5C, the solder resist layers 6, the solder balls 7, the adhesive layer 8, the bonding wires 9, the encapsulation member 10, the through-holes 11, and the second sides 13A, those being portions of the semiconductor device 100. The first base platings 4A, the first copper platings 4B, and the first nickel-gold platings 4C form the surface wires 4. The second base platings 5A, the second copper platings 5B, and the second nickel-gold platings 5C form the lower wires 5. In FIG. 3B, the same elements as the elements shown in FIG. 1 have the same reference numerals as those of the elements shown in FIG. 1.

The first base platings 4A are arranged on the first laminate resin layer 2B and the second base platings 5A are arranged on the second laminate resin layer 2C. The first and second base platings 4A and 5A are made of, for example, copper, nickel, or flash gold. The first and second base platings 4A and 5A have a thickness of, for example, 2 to 5 μm. The first copper platings 4B are disposed on the first base platings 4A and the second copper platings 5B are disposed on the second base platings 5A. The first and second copper platings 4B and 5B preferably have a thickness of, for example, 10 to 15 μm. The first nickel-gold platings 4C are disposed on the first copper platings 4B and the second nickel-gold platings 5C are disposed on the second copper platings 5B. It is preferable that the first and second nickel-gold platings and 4C and 5C be electrically continuous with the bonding wires 9. The first and second nickel-gold platings and 4C and 5C preferably have a thickness of, for example, 0.3 to 0.7 μm.

In the separating step, the substrate 2 is warped due to the external impact load applied thereto when the connecting portions 13 are cut. Therefore, stresses are concentrated at regions ranging from the encapsulation member-forming region 300 of the semiconductor device 100 to the connecting portions 13 of the substrate 2; hence, the substrate 2 is strained.

The solder resist layers 6 are disposed on the substrate 2. The solder resist layers 6 protect the surface wires 4 and the lower wires 5. The solder resist layers 6 are made of a hard, inflexible material and are in contact with the surface wires 4 arranged in the outermost wiring layer of the substrate 2. Therefore, the warpage of the substrate 2 causes cracks in the solder resist layers 6. The creation of the cracks in the solder resist layers 6 generates the force to pull the surface wires 4 in the width direction of the cracks. This causes other cracks in the surface wires 4 arranged under the solder resist layers 6. The cracks in the surface wires 4 are grown because of the mechanical stress caused by the temperature change of the usage environment. This will probably break the surface wires 4.

A cause of the breakage of the surface wires 4 is probably as follows: stresses are concentrated at regions ranging from the encapsulation member-forming region 300 to the connecting portions 13 of the substrate 2 during the handling of the substrate 2 in manufacturing steps or in a rinsing step and therefore the substrate 2 is strained.

With reference to FIGS. 3A and 3B, the surface wires 4 are arranged in the wiring/packaging permission zone, which includes the encapsulation member-forming region 300 for forming the encapsulation member 10 and also includes the regions located between the first sides 12A and the first peripheral portions 10A of the encapsulation member-forming region 300 that are opposed to the first sides 12A. The substrate 2 is strained due to the stresses applied to the regions ranging from the encapsulation member-forming region 300 of the substrate 2 to the second sides 13A; hence, cracks may be created in the solder resist layers 6. Since the surface wires 4, which extend under the solder resist layers 6, are arranged only in the wiring/packaging permission zone, portions of the substrate 2 where the surface wires 4 are present are only slightly warped. Therefore, cracks are prevented from being created in the surface wires 4. This prevents the breakage of the surface wires 4.

Since the pores 12 are present in the substrate 2, stresses are hardly applied to portions between the encapsulation member-forming region 300 and the first sides 12A in the separating step. Therefore, the substrate portions between the encapsulation member-forming region 300 and the first sides 12A are less warped than portions of the base plate 200 that are located between the encapsulation member-forming region 300 and the second sides 13A. Since the warpage of portions of the substrate 2 that are located between the encapsulation member-forming region 300 and the pores 12 is slight, the breakage of the surface wires 4 can be prevented because the surface wires 4 are located between the encapsulation member-forming region 300 and the pores 12 is slight.

The solder balls 7 are disposed on the lower wires 5 (the second nickel-gold platings 5C), which are connected to the through-holes 11. Regions where the surface wires 4 are not present but the first or second intermediate wires 3A or 3B or the lower wires 5 are present can be connected to the solder balls 7, which serve as external terminals, with the first or second intermediate wires 3A or 3B or the lower wires 5.

FIG. 4 is an enlarged top view of a semiconductor device 500 that is the first modification of the semiconductor device 100 according to the first embodiment. FIG. 4 particularly shows a corner of this semiconductor device 500. This semiconductor device 500 includes surface wires 4, first intermediate wires 3A, second intermediate wires 3B, solder resist layers 6, a encapsulation member 10, first peripheral portions 10A of a encapsulation member-forming region 300 that are opposed to first sides 12A, second peripheral portions 10B of the encapsulation member-forming region 300 that are opposed to second sides 13A, first through-holes 11, second through-holes 11', the first sides 12A, the second sides 13A, plating leads 16, and the encapsulation member-forming region 300. In FIG. 4, the same elements as the elements shown in FIG. 1 have the same reference numerals as those of the elements shown in FIG. 1. The plating leads 16 are used to form platings by, for example, an electroplating process. In particular, the platings are formed in such a manner that a substrate 2 is immersed in an aqueous solution of a metal salt and a voltage is applied between the plating leads 16.

With reference to FIG. 4, the plating leads 16 and the second through-holes 11' are arranged between these second sides 13A and this encapsulation member-forming region 300 for forming this encapsulation member 10. Cracks may be created in these solder resist layers 6 or the second through-holes 11' in steps of manufacturing this semiconductor device 500 and therefore either the plating leads 16 are the second through-holes 11' may be broken. These surface wires 4, which extend under these solder resist layers 6, are arranged in a wiring/packaging permission zone which includes this encapsulation member-forming region 300 for forming this encapsulation member 10 and also includes regions located between these first sides 12A and these first peripheral portions 10A of this encapsulation member-forming region 300 that are opposed to these first sides 12A; hence, portions of this substrate 2 where these surface wires 4 are present are only slightly warped. Therefore, cracks are prevented from being created in these surface wires 4. This prevents the breakage of these surface wires 4.

FIG. 5A is an enlarged top view of a semiconductor device 600 that is the second modification of the semiconductor device 100 according to the first embodiment. FIG. 5A particularly shows a corner of this semiconductor device 600. This semiconductor device 600 includes first intermediate wires 3A, second intermediate wires 3B, surface wires 4, solder resist layers 6, a encapsulation member 10, first peripheral portions 10A of a encapsulation member-forming region 300 that are opposed to first sides 12A, second peripheral portions 10B of the encapsulation member-forming region 300 that are opposed to second sides 13A, first through-holes 11, second through-holes 110, the first sides 12A, the second sides 13A, and the encapsulation member-forming region 300. These surface wires 4 are arranged in this encapsulation member-forming region 300. These first through-holes 11 are also arranged in this encapsulation member-forming region 300 and are connected to a driving region A, which is not shown, with these surface wires 4. These second through-holes 110 are present in wiring/packaging prohibition regions located between these second sides 13A and these second peripheral portions 10B of this encapsulation member-forming region 300 that are opposed to these second sides 13A. These second through-holes 110 are connected to these first through-holes 11 with these first and second intermediate wires 3A and 3B. In FIG. 5A, the same elements as the elements shown in FIG. 1 have the same reference numerals as those of the elements shown in FIG. 1.

FIG. 5B is an enlarged sectional view of this semiconductor device 600 taken along the line C-C' of FIG. 5A. FIG. 5B shows a substrate 2, a core resin layer 2A, a first laminate resin layer 2B, a second laminate resin layer 2C, these first intermediate wires 3A, these second intermediate wires 3B, base platings 5A, copper platings 5B, nickel-gold platings 5C, these solder resist layers 6, solder balls 7, this encapsulation member 10, these second sides 13A, and these second through-holes 110, those being portions of this semiconductor device 600. These base platings 5A, these copper platings 5B, and these nickel-gold platings 5C form lower wires 5. These first and second intermediate wires 3A and 3B are connected to these solder balls 7, which serve as external terminals, through these lower wires 5 and these second through-holes 110. In FIG. 5B, the same elements as the elements shown in FIG. 3B have the same reference numerals as those of the elements shown in FIG. 1.

With reference to FIG. 5A or 5B, this semiconductor piece 1 is connected to these solder balls 7, which serve as external terminals, through these surface wires 4, these second through-holes 110, these first and second intermediate wires 3A and 3B, and these lower wires 5. In steps of manufacturing this semiconductor device 600, cracks may be created in these solder resist layers 6. These surface wires 4, which extend under these solder resist layers 6, are arranged in a wiring/ packaging permission zone which includes this encapsulation member-forming region 300 for forming this encapsulation member 10 and also includes regions located between these first sides 12A and these first peripheral portions 10A of this encapsulation member-forming region 300 that are opposed to these first sides 12A. Therefore, these surface wires 4, as well as those of the semiconductor device 100 of the first embodiment, can be prevented from being broken.

On the other hand, these first and second intermediate wires 3A and 3B are arranged between this encapsulation member-forming region 300 and these second sides 13A instead of these surface wires 4. These first intermediate wires 3A are located between this core resin layer 2A and this first laminate resin layer 2B. Therefore, if cracks are created in portions of each solder resist layer 6 that are located between this encapsulation member-forming region 300 and these second sides 13A in the manufacturing steps of this semiconductor device 600, the cracks in the solder resist layer 6 have no influence on these first and second intermediate wires 3A and 3B. Therefore, these first and second intermediate wires 3A and 3B can be prevented from being broken. Furthermore, this semiconductor piece 1 can be connected to these solder balls 7, which serve as external terminals, through these first and second intermediate wires 3A and 3B. This allows this semiconductor piece 1 and these solder balls 7, which serve as external terminals, to be present between this encapsulation member-forming region 300 and these second sides 13A.

[Summary of Semiconductor Device According to First Embodiment]

A semiconductor device according to this embodiment includes a package including a substrate including a plurality of wiring layers, having a first side and a second side, having an encapsulation member formed on one surface of the substrate, and a surface wire formed in one of the wiring layers located closest to the encapsulation member. The surface wires are formed in a wiring and packaging permission zone, including an encapsulation member-forming region for forming the encapsulation member, and regions located between the first sides and peripheral portions of the encapsulation member-forming region opposed to the first sides.

Each end of the peripheral portions is located closest to each end of the first sides.

The surface wires are arranged only in the encapsulation member-forming region.

The substrate has through-holes. The through-holes are present in wiring/packaging prohibition regions located between the second sides and peripheral portions of the encapsulation member-forming region that are opposed to the second sides and are connected to wires, arranged above the substrate, other than the surface wires.

The semiconductor device further includes plating leads for electroplating the wires or conductive members placed in the through-holes. The plating leads are arranged in the wiring/packaging prohibition regions.

Each end of the peripheral portions is located closest to each end of the second sides.

The semiconductor device further includes external terminals for electrically connecting the semiconductor device to the outside. The external terminals are connected to the wires or the through-holes.

The external terminals are solder balls.

Second Embodiment

A method for manufacturing semiconductor devices according to a second embodiment of the present invention will now be described in detail with reference to FIGS. 6, 7, 8A, 8B, 9A, 9B, 10A, 10B, 11A, 11B, 12A, 12B, 13, and 14. The semiconductor devices each include a substrate, separated off from a base plate, including a plurality of wiring layers and also each include an encapsulation member disposed above the substrate. The semiconductor device-manufacturing method according to the second embodiment is characterized in that the breakage of surface wires is prevented in a separating step of cutting the base plate into pieces.

FIGS. 6, 7, 8A, 8B, 9A, 9B, 10A, 10B, 11A, 11B, 12A, 12B, 13, and 14 are illustrations showing principal steps of the semiconductor device-manufacturing method according to the second embodiment.

Figure 6:
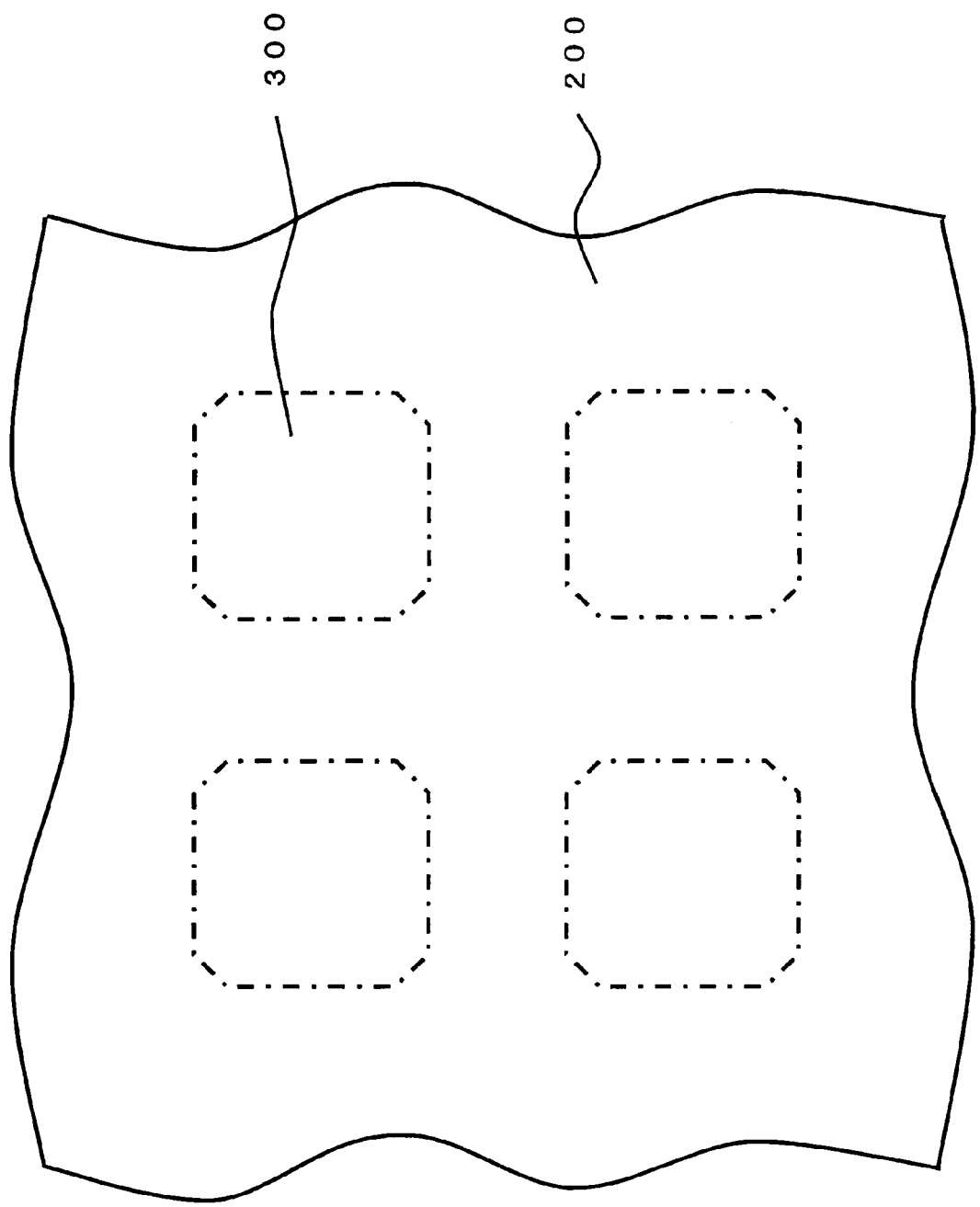
FIG. 6 is an illustration showing a manufacturing step of a semiconductor device according to a second embodiment.

FIG. 6 is a sectional view illustrating a step of preparing a base plate 200 having encapsulation member-forming regions 300 for forming encapsulation members 10 for encapsulation semiconductor pieces 1. FIG. 6 particularly shows the base plate 200, which has the encapsulation member-forming regions 300. The base plate 200 includes insulative core resin layers 2A described below. The core resin layers 2A are each located between first intermediate wires 3A and second intermediate wires 3B. The base plate 200 (substrates 2) preferably has a thickness of, for example, 0.56 mm. The encapsulation member-forming regions 300 are areas for forming the encapsulation members 10 for encapsulation the semiconductor pieces 1. Examples of wires to be formed in the substrates 2 include the first and second intermediate wires 3A and 3B, surface wires 4, and lower wires 5. The first and second intermediate wires 3A and 3B, the surface wires 4, and the lower wires 5 are arranged in four wiring layers insulated from each other with a core resin layer 2A, first laminate resin layer 2B, or second laminate resin layer 2C disposed therebetween.

FIG. 7 illustrates a pore-forming step of forming pores 12 for dividing the base plate 200 into pieces. The pores 12 are formed around each encapsulation member-forming region 300 such that connecting portions 13 connecting the pieces remain in the base plate 200. In particular, FIG. 7 shows the pores 12 and the connecting portions 13 in addition to the configuration shown in FIG. 6.

The configuration shown in FIG. 7 is formed by a procedure below. The pores 12 are formed in the base plate 200 by routering so as to surround the encapsulation member-forming region 300. Each connecting portion 13 is located between the pores 12. The substrate 2, which are formed in a separating step of separating the semiconductor devices 100 from the base plate 200, have first sides 12A that are portions of the pores 12, second sides 13A formed by cutting the connecting portions 13 in the separating step, and the encapsulation member-forming region 300 for forming the encapsulation members 10. The substrates 2 have a configuration in which each encapsulation member-forming region 300 is surrounded by the first sides 12A and the second sides 13A.

Since the pores 12 are present in the substrates 2, stresses are hardly applied to portions between the encapsulation member-forming regions 300 and the first sides 12A in the separating step. Therefore, the substrate portions between the encapsulation member-forming regions 300 and the first sides 12A are less warped than portions of the base plate 200 that are located between the encapsulation member-forming regions 300 and the second sides 13A.

Figure 8A:
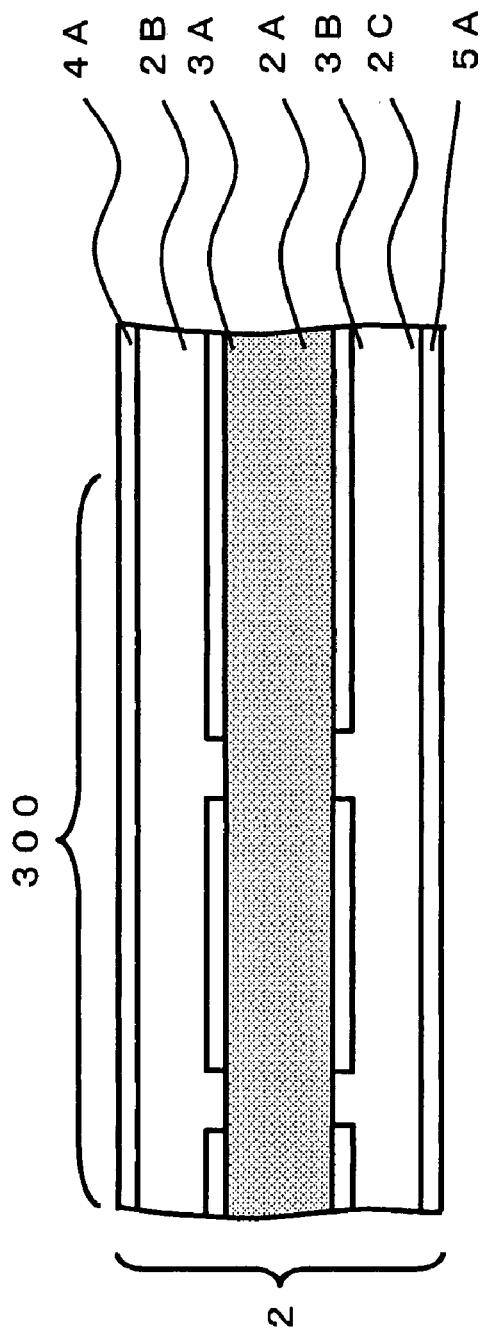
FIGS. 8A and 8B are illustrations showing manufacturing steps of the semiconductor device according to the second embodiment.

FIG. 8A shows one of the substrates 2 having no through-holes. FIG. 8A is a sectional view of the substrate 2 taken along the line D-D' of FIG. 7. FIG. 8A shows the substrate 2, a core resin layer 2A, a first laminate resin layer 2B, a second laminate resin layer 2C, first intermediate wires 3A, second intermediate wires 3B, first base platings 4A for forming surface wires 4, and second base platings 5A for forming lower wires 5.

The substrate 2 includes the core resin layer 2A, the first laminate resin layer 2B, the second laminate resin layer 2C, and the first and second intermediate wires 3A and 3B. The substrate 2 has a thickness of, for example, 0.56 mm. The core resin layer 2A is made of a material which has a high glass transition point (Tg) and high heat resistance and which is readily drillable. The core resin layer 2A is preferably made of a glass-epoxy resin material. The core resin layer 2A preferably has a thickness of, for example, 0.2 mm. The first and second resin layers 2B and 2C are located on both sides of the core resin layer 2A. The first and second resin layers 2B and 2C are preferably each made from a prepreg with a thickness of, for example, 0.1 mm. The first intermediate wires 3A are located between the core resin layer 2A and the first laminate resin layer 2B. The second intermediate wires 3B are located between the core resin layer 2A and the second laminate resin layer 2C. The first and second intermediate wires 3A and 3B are preferably each made from a copper foil with a thickness of, for example, 36 to 70 μm. Although the first and second intermediate wires 3A and 3B are located on both sides of the core resin layer 2A in this embodiment, the first and second intermediate wires 3A and 3B may be omitted.

The surface wires 4 are arranged on a surface of the substrate 2 on which the encapsulation member-forming region 300 for forming an encapsulation member 10 is disposed. The lower wires 5 are arranged on a surface of the substrate 2 on which solder balls 7 are arranged. The first and second intermediate wires 3A and 3B are wiring patterns formed by etching. The surface wires 4 are arranged on the first laminate resin layer 2B. The lower wires 5 are arranged on the second laminate resin layer 2C. The surface wires 4 and the lower wires 5 are preferably each made from a laminate including, for example, a copper plating, a nickel plating, and a gold plating. The surface wires 4 and the lower wires 5 are wiring patterns formed by etching and have a thickness of 20 to 25 μm. The first and second base platings 4A and 5A are formed by depositing copper sub-platings, nickel sub-platings, and flash gold sub-platings on the core resin layer 2A in that order. The first and second base platings 4A and 5A have a thickness of, for example, 2 to 5 μm.

Figure 8B:
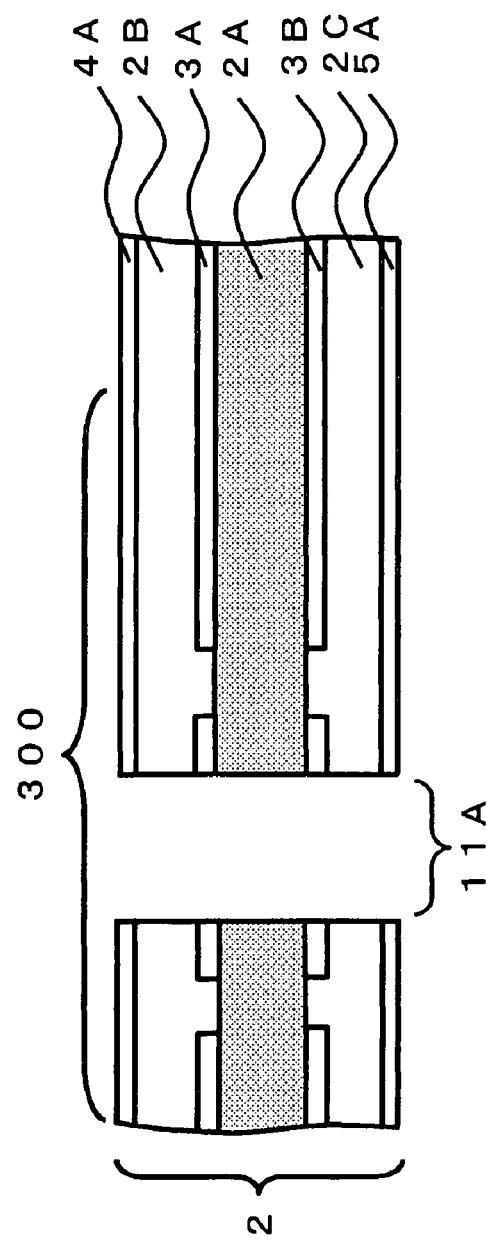

FIG. 8B illustrates a through-hole perforation-forming step of forming through-hole perforations 11A in the substrate 2. In particular, FIG. 5B shows the through-hole perforations 11A in the substrate 2 in addition to the configuration shown in FIG. 8A.

The configuration shown in FIG. 5B is formed as described below. The through-hole perforations 11A are preferably formed so as to have a diameter of, for example, 0.15 to 0.2 mm. The through-hole perforations 11A are formed by, for example, drilling. After the through-hole perforations 11A are formed, the walls of the through-hole perforations 11A are cleaned.

Figure 9A:
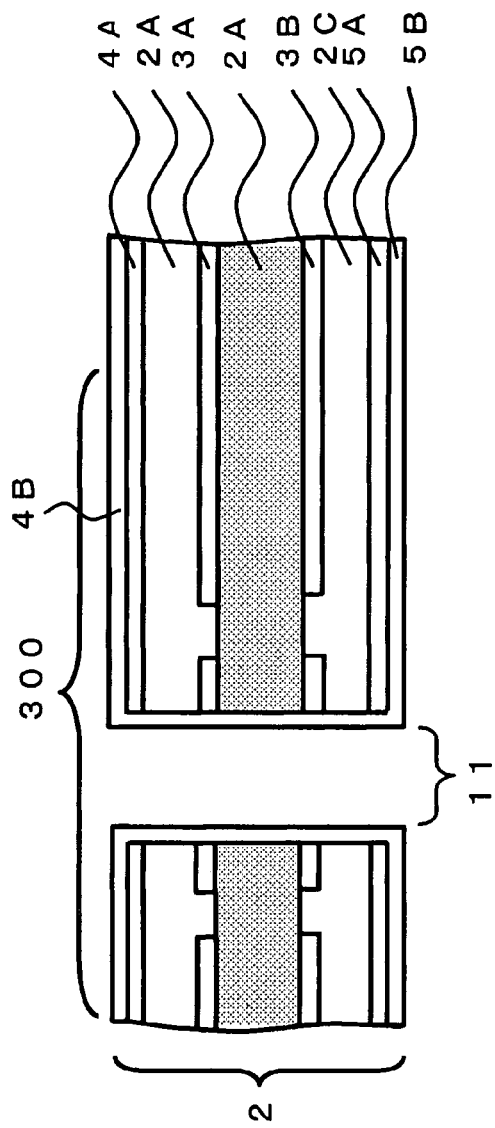
FIGS. 9A and 9B are illustrations showing manufacturing steps of the semiconductor device according to the second embodiment.

FIG. 9A illustrates a copper-plating step of forming copper platings and second copper platings 5B on the substrate 2. In particular, FIG. 9A shows first copper platings 4B formed on the first base platings 4A, second copper platings 5B formed on the second base platings 5A, and third copper platings 11B formed on the wall of the through-hole perforations 11A in addition to the configuration shown in FIG. 8B.

The configuration shown in FIG. 9A is formed as described below. The first, second, and third copper platings 4B, 5B, and 11B are formed on the first base platings 4A, the second base platings 5A, and the wall of the through-hole perforations 11A, respectively, so as to have a thickness of, for example, 10 to 15 μm. The first, second, and third copper platings 4B, 5B, and 11B are formed by, for example, an electroless plating process. Through-holes 11 are formed by providing the through-hole perforations 11A on the wall of the through-hole perforations 11A.

Figure 9B:
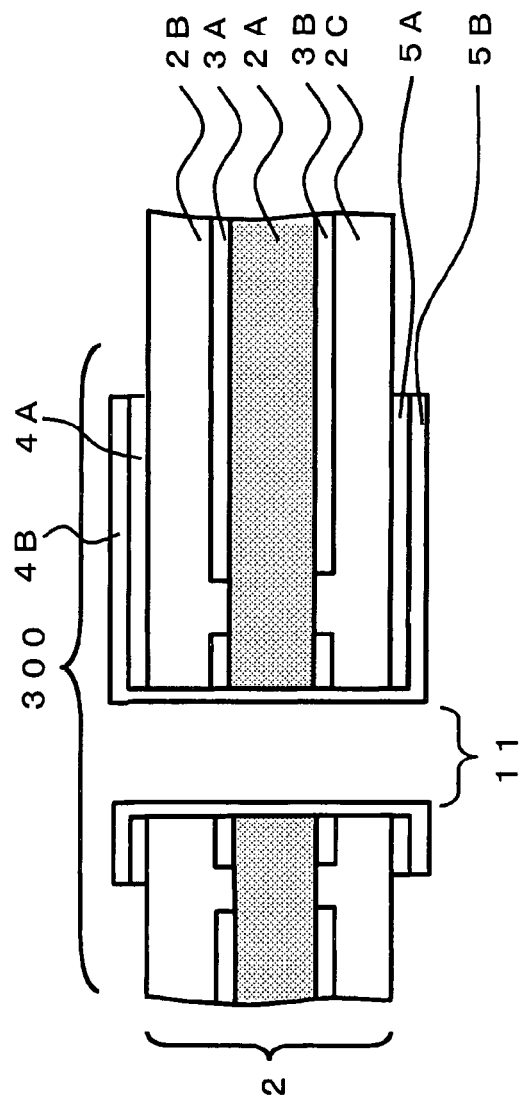

FIG. 9B illustrates a surface wire-forming step of forming surface wires 4 in the encapsulation member-forming region 300 or between the pores 12 and the encapsulation member-forming region 300. In particular, FIG. 9B shows the surface wires 4 and lower wires 5 formed by etching subsequently to FIG. 9A.

The configuration shown in FIG. 9B is formed by a procedure below. Photosensitive dry films, which are not shown, are attached to the upper and lower surfaces of the substrate 2, exposed, and then developed, whereby etching resist layers, which are not shown, are formed on the substrate 2. An etching solution is applied onto the upper and lower surfaces of the substrate 2, whereby portions of the surface and lower wires 4 and 5 that are exposed from the etching resist layers are removed. After etching, the remaining etching resist layers are removed. In this step, the surface wires 4 are formed in the encapsulation member-forming region 300 of the substrate 2 in which the encapsulation member 10 is formed.

FIG. 10A illustrates a solder resist layer-forming step of forming solder resist layers 6 on the substrate 2. In particular, FIG. 10A shows the solder resist layers 6 in addition to the configuration shown in FIG. 9B. The solder resist layers 6 are hard coatings. The solder resist layers 6 preferably have a thickness of, for example, 36 μm.

The configuration shown in FIG. 10A is formed by a procedure below. The solder resist layers 6 are laminated on both faces of the substrate 2, exposed, and then developed. In the solder resist layer-forming step, openings are formed in the solder resist layers 6 so as to correspond to portions of the surface wires 4 that are to be connected to semiconductor piece electrodes 1A or portions of the lower wires 5 on which solder balls 7 are to be formed.

FIG. 10B shows a configuration that is formed in such a manner that first nickel-gold platings 4C and second nickel-gold platings 5C are formed by depositing nickel and gold in sequence on the first copper platings 4B and the second copper platings 5B, respectively. In particular, FIG. 10B shows the first and second nickel-gold platings and 4C and 5C in addition to the configuration shown in FIG. 10A. The first and second nickel-gold platings 4C and 5C are formed on the first and second copper platings 4B and 5B, respectively. The first and second nickel-gold platings 4C and 5C are electrically continuous with bonding wires 9. The first and second nickel-gold platings 4C and 5C preferably have a thickness of, for example, 0.3 to 0.7 μm.

The configuration shown in FIG. 10B is formed by a procedure below. Nickel platings are formed on the first and second copper platings 4B and 5B by, for example, an electroplating process in such a manner that after the substrate 2 is immersed in an aqueous solution of a metal salt, a voltage is applied between plating leads, which are not shown. Gold platings are formed on the nickel platings by, for example, an electroplating process. This allows the first and second nickel-gold platings and 4C and 5C to be formed on the first and second copper platings 4B and 5B, respectively.

Figures 11A, 11B:
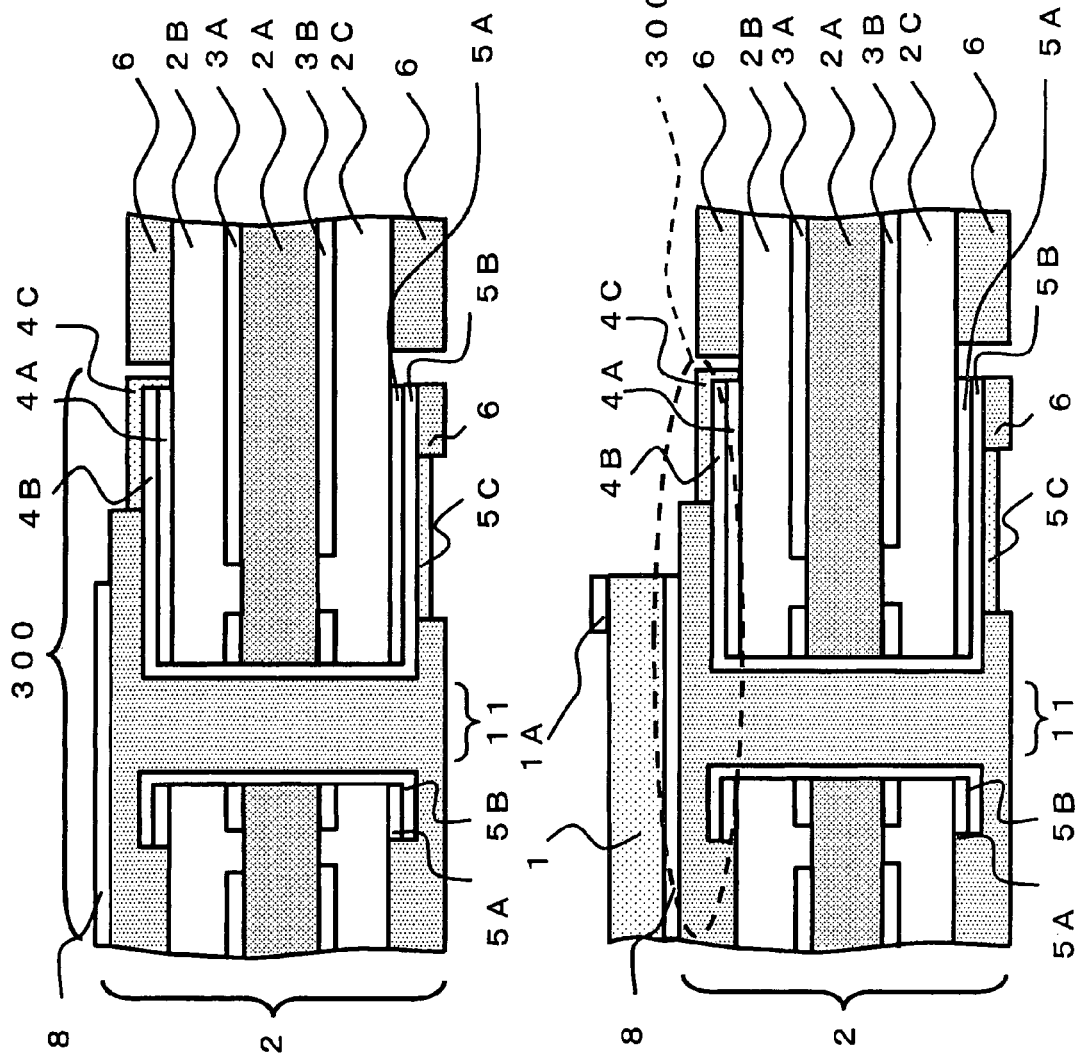
FIGS. 11A and 11B are illustrations showing manufacturing steps of the semiconductor device according to the second embodiment.

FIG. 11A illustrates an adhesive layer-providing step of providing an adhesive layer 8, for fixing a semiconductor piece 1, on one of the solder resist layers 6 that is disposed on one surface of the substrate 2. In particular, FIG. 11A shows the adhesive layer 8 in addition to the configuration shown in FIG. 10B. The adhesive layer 8 is made of, for example, a silver-epoxy-based die-bonding material.

The configuration shown in FIG. 11A is formed by a procedure below. In one surface of the substrate 2, the adhesive layer 8, which is made of the die-bonding material, is provided on a portion of the encapsulation member-forming region 300 on which the semiconductor piece 1 is to be formed. The adhesive layer 8 is preferably formed with a die bonder.

FIG. 11B illustrates a providing step of providing the semiconductor piece 1 in the encapsulation member-forming region 300. In particular, FIG. 11B shows the semiconductor piece 1 and the semiconductor piece electrodes 1A in addition to the configuration shown in FIG. 11A.

The configuration shown in FIG. 11B is formed by a procedure below. The semiconductor piece 1 is provided on the adhesive layer 8, which is disposed in the encapsulation member-forming region 300, such that the semiconductor piece electrodes 1A extend in parallel to one surface of the substrate 2. The adhesive layer 8 is dried until the adhesive layer 8 is cured, whereby the semiconductor piece 1 is fixed on the adhesive layer 8.

Figures 12A, 12B:
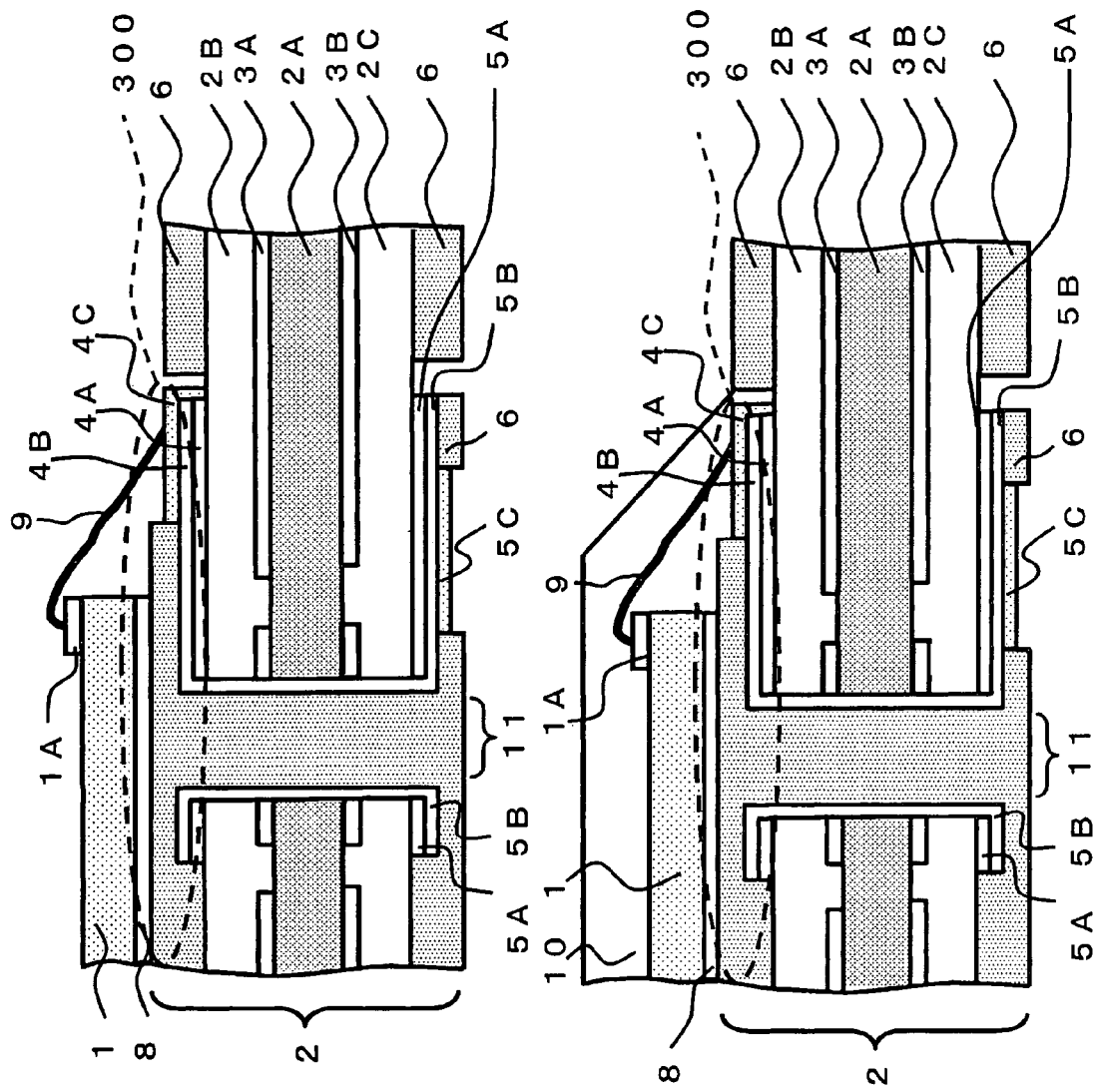
FIGS. 12A and 12B are illustrations showing manufacturing steps of the semiconductor device according to the second embodiment.

FIG. 12A illustrates a connecting step of connecting the semiconductor piece 1 to the surface wires 4. In particular, FIG. 12A shows the bonding wires 9 in addition to the configuration shown in FIG. 11B. The bonding wires 9 are preferably made of, for example, gold, aluminum, or copper. The bonding wires 9 preferably have a diameter of, for example, 30 μm.

The configuration shown in FIG. 12A is formed by a procedure below. The bonding wires 9 are formed with, for example, a wire bonder. The bonding wires 9 connect the semiconductor piece electrodes 1A to the surface wires 4 of the substrate 2.

FIG. 12B illustrates a encapsulation step of forming the encapsulation member 10, for encapsulation the semiconductor piece 1, over the encapsulation member-forming region 300. In particular, FIG. 12B shows the encapsulation member 10 formed above the encapsulation member-forming region 300 on the substrate 2 in addition to the configuration shown in FIG. 12A.

The configuration shown in FIG. 12B is formed by a procedure below. An epoxy resin is provided over the encapsulation member-forming region 300 of the substrate 2 by, for example, a transfer molding process, whereby the encapsulation member 10 for encapsulation the semiconductor piece 1 and the bonding wires 9 is formed.

Figure 13:
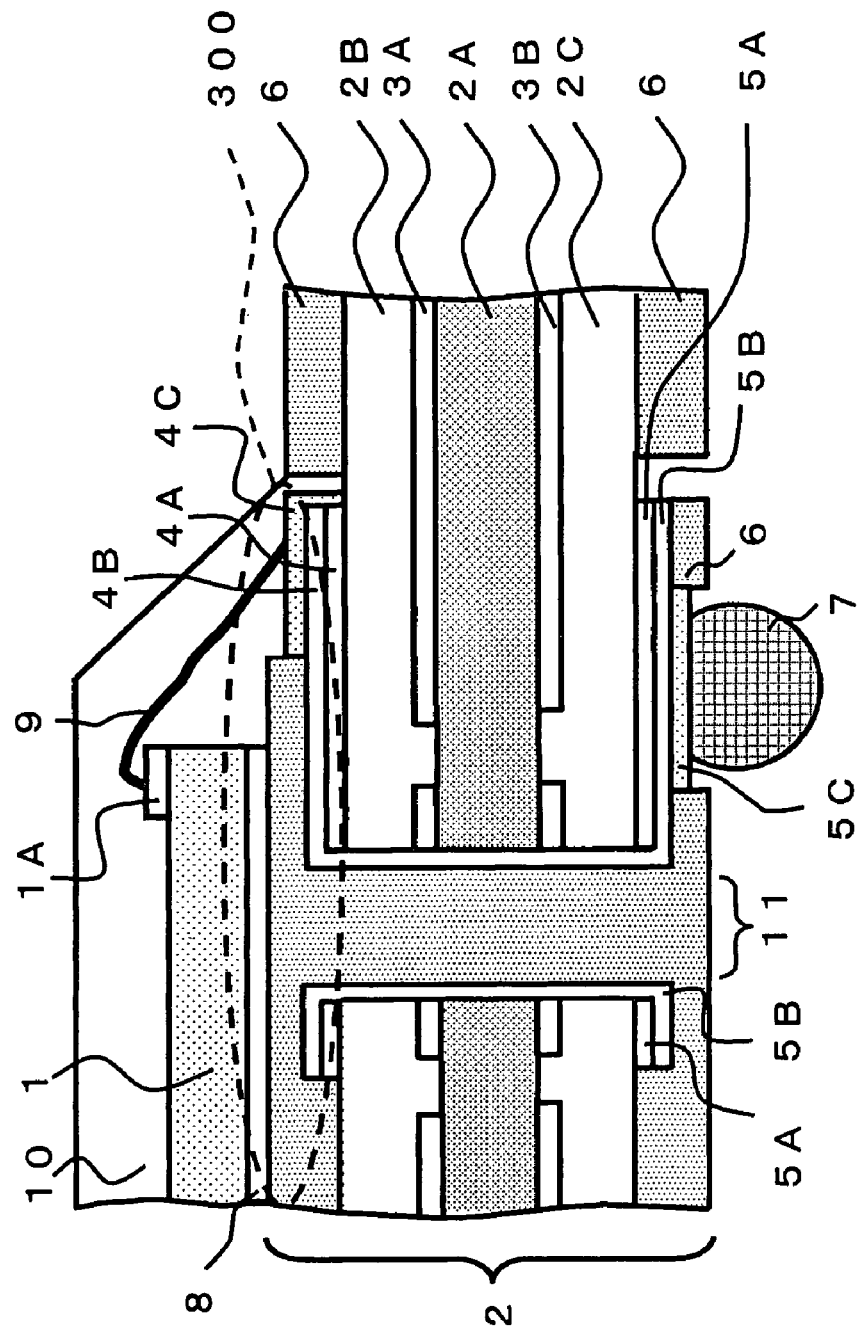
FIG. 13 is an illustration showing a manufacturing step of the semiconductor device according to the second embodiment.

FIG. 13 illustrates an external terminal-forming step of forming solder balls 7, serving as external terminals, on the lower wires 5. In particular, FIG. 13 shows the solder balls 7 formed on the lower wires 5 of the substrate 2 in addition to the configuration shown in FIG. 12B. The solder balls 7 are preferably made of, for example, lead-tin (Pb—Sn).

The configuration shown in FIG. 13 is formed by a procedure below. A flux, which is not shown, is applied to the substrate 2. After the application of the flux, the solder balls 7 are mounted on the lower wires 5. After the mounting of the solder balls 7 on the lower wires 5, the solder balls 7 are fixed on the lower wires 5 by, for example, a reflow process. After the fixation of the solder balls 7 on the lower wires 5, the flux is removed off by cleaning.

Figure 14:
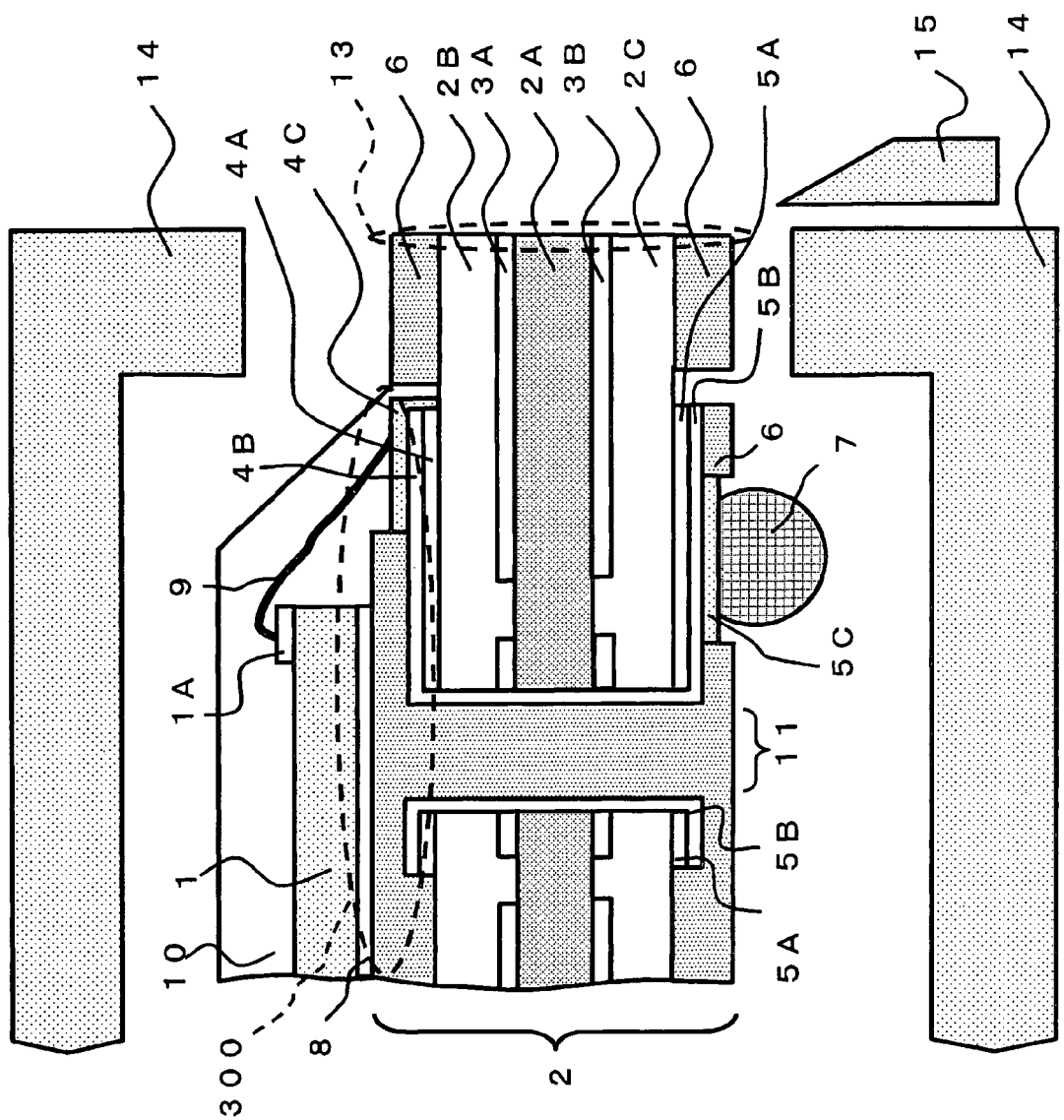
FIG. 14 is an illustration showing a manufacturing step of the semiconductor device according to the second embodiment.

FIG. 14 illustrates a separating step of dividing the base plate 200 into pieces by cutting the connecting portions 13 in detail. In particular, FIG. 14 shows the connecting portions 13 of the substrate 2, a mold 14, and a cutter 15 in addition to the configuration shown in FIG. 13. The mold 14 is set on a pressing machine in such a manner that the substrate 2 is fixed in the mold 14. The cutter 15 is used to cut the connecting portions 13 of the substrate 2.

The configuration shown in FIG. 14 is formed by a procedure below. A peripheral portion of the substrate 2 is retained with the mold 14. The mold 14 is set on the pressing machine, which is not shown. The connecting portions 13 of the substrate 2 are then cut with the cutter 15. The substrate 2 is separated off from the base plate 200 as described above, whereby a semiconductor device is completed.

With reference to FIG. 14, the surface wires 4 are arranged in the encapsulation member-forming region 300. In the separating step, the substrate 2 is warped by the external impact load caused by cutting the connecting portions 13. That is, the warpage of the substrate 2 is caused by the stresses concentrated at regions ranging from the encapsulation member-forming region 300 to the connecting portions 13.

The solder resist layers 6 are surface portions of the substrate 2. The solder resist layers 6 are used to protect the surface wires 4 and the lower wires 5. The solder resist layers 6 are made of a hard, inflexible material. Furthermore, the solder resist layers 6 are in tight contact with the surface wires 4 disposed in a wiring layer located closest to a surface of the substrate 2. Therefore, the warpage of the substrate 2 creates cracks in the solder resist layers 6. The creation of the cracks in the solder resist layers 6 generates the force to pull the surface wires 4 in the width direction of the cracks. This causes cracks in the surface wires 4 located under the solder resist layers 6. The cracks in the surface wires 4 grow because of the mechanical stress caused by the change in the temperature of the usage environment. This may break the surface wires 4.

Furthermore, stresses are concentrated at the regions ranging from the encapsulation member-forming region 300 to the connecting portions 13 of the substrate 2 during the handling of the substrate 2 in manufacturing steps or in a rinsing step. This may warp the substrate 2 to break the surface wires 4.

As shown in FIG. 14, the surface wires 4 are arranged only in the encapsulation member-forming region 300 or between the encapsulation member-forming region 300 and the pores 12. Cracks may be caused in the solder resist layers 6 because the substrate 2 is warped by the stresses concentrated at regions ranging from the encapsulation member-forming region 300 to the connecting portions 13 of the substrate 2. According to the manufacturing method, the warpage of a portion of the substrate 2 in which the surface wires 4 are arranged is slight because the surface wires 4, which are located under the solder resist layers 6, are arranged only in the encapsulation member-forming region 300 or between the encapsulation member-forming region 300 and the pores 12. Since the warpage of the portion of the substrate 2 in which the surface wires 4 are arranged is slight, cracks can be prevented from being created in the surface wires 4. This prevents the breakage of the surface wires 4.

Since the pores 12 are present in the substrate 2, stresses are hardly applied to portions between the encapsulation member-forming region 300 and the pores 12. Therefore, portions of the substrate 2 that are located between the encapsulation member-forming region 300 and the pores 12 are less warped than portions of the base plate 200 that are located between the encapsulation member-forming region 300 and the second sides 13A. Since the warpage of the portions of the substrate 2 that are located between the encapsulation member-forming region 300 and the pores 12 is slight, the surface wires 4 can be prevented from being broken in such a manner that the surface wires 4 are arranged between the encapsulation member-forming region 300 and the pores 12.

[Summary of Method for Manufacturing Semiconductor Device According to Second Embodiment]

A package manufacturing method including a substrate divided from a base substrate having a plurality of wiring layers and a encapsulation member formed on one surface of the substrate, has forming a pore for dividing the base substrate into each of the substrates, the pore being formed around a encapsulation member-forming region for forming the encapsulation member remaining a connecting portion connecting each of the substrates in the base substrate, forming surface wires in one of the wiring layers being located closest to the encapsulation member, forming the encapsulation member on the substrate surface; and dividing the base substrate into each of the substrates by cutting the connecting portions.

Each end of peripheral portions is located closest to each end of the first sides.

The present invention is not limited to the configurations described in the above embodiments. Various modifications may be made within the scope of the present invention.

The invention claimed is:

1. An electronic device comprising:
    a substrate having a plurality of wiring layers;
    an electronic element mounted above the substrate;
    an encapsulation member covered over the electronic element and a part of the substrate;
    a first functional surface wiring formed in an exposed layer of the wiring layers above the substrate, the first functional surface wiring connecting to the electronic element, the first functional surface wiring being arranged in the part of the substrate;
    a second functional surface wiring formed in the exposed layer of the wiring layers above the substrate, the second functional surface wiring being disposed in a plurality of first peripheral portions adjacent to a plurality of second peripheral portions of the substrate, one of the first peripheral portions being surrounded by a region arranging the encapsulation member and two of the second peripheral portions, the second peripheral portions being corner areas of the substrate; and
    an intermediate wiring formed in an intermediate layer of the wiring layers;
    wherein the substrate has a first through-hole disposed in the part of the substrate, the first through-hole being connected to the first functional surface wiring and the intermediate wiring; and
    wherein the substrate has a second through-hole disposed in the first peripheral portions of the substrate, the second through-hole being connected to the intermediate wiring and the second functional surface wiring, the intermediate wiring extending from the first through-hole to the second through-hole.

2. The electronic device according to claim 1, wherein the electronic device further includes plating leads for electroplating the exposed layer of the wiring layers above the substrate or conductive members placed in the first through-hole or the second through-hole, the plating leads being arranged in the second peripheral portions of the substrate, the plating leads being connected to third through-holes formed in the second peripheral portions of the substrate, the third through-holes connected to the intermediate wiring.

3. The electronic device according to claim 2, wherein the electronic device further includes an external terminal for electrically connecting the electronic element to another surface of the substrate, the external terminal being connected to the first functional surface wiring, the second functional surface wiring, the first through-hole or the second through-hole.

4. The electronic device according to claim 3, wherein the external terminal is a solder ball.

* * * * *